(12) United States Patent
Chang

(10) Patent No.: US 11,489,500 B2
(45) Date of Patent: Nov. 1, 2022

(54) DIFFERENTIAL AMPLIFIER

(71) Applicant: SK hynix Inc., Icheon (KR)

(72) Inventor: Keun Jin Chang, Icheon (KR)

(73) Assignee: SK hynix Inc., Icheon (KR)

( * ) Notice: Subject to any disclaimer, the term of this patent is extended or adjusted under 35 U.S.C. 154(b) by 120 days.

(21) Appl. No.: 16/934,985

(22) Filed: Jul. 21, 2020

(65) Prior Publication Data

US 2021/0305954 A1   Sep. 30, 2021

(30) Foreign Application Priority Data

Mar. 27, 2020 (KR) .......................... 10-2020-0037297

(51) Int. Cl.
*H03F 3/45* (2006.01)
(52) U.S. Cl.
CPC ............ *H03F 3/45076* (2013.01); *H03F 3/45* (2013.01); *H03F 3/45183* (2013.01); *H03F 2203/45594* (2013.01)
(58) Field of Classification Search
CPC ....... H03F 3/45076; H03F 2203/45594; H03F 3/45183; H03F 1/301; H03F 2203/45248; H03F 2203/45404

USPC .................................................. 330/252–261
See application file for complete search history.

(56) References Cited

U.S. PATENT DOCUMENTS

2013/0200953 A1\* 8/2013 Tsai .................... H03F 3/45188
330/253

FOREIGN PATENT DOCUMENTS

KR   100460794 B    12/2004
KR   100833624 B1    5/2008

\* cited by examiner

*Primary Examiner* — Khanh V Nguyen
*Assistant Examiner* — Khiem D Nguyen

(57) ABSTRACT

A differential amplifier of a memory controller may include: an amplification stage configured to amplify input differential signals to generate intermediate differential signals; a control circuit configured to control slew rates for the intermediate differential signals; and an output circuit configured to selectively perform one or more switching operations according to the intermediate differential signals to generate output differential signals.

22 Claims, 7 Drawing Sheets

DIFFERENTIAL AMPLIFIER

CROSS-REFERENCES TO RELATED APPLICATION

The present application claims priority under 35 U.S.C. § 119(a) to Korean application number 10-2020-0037297, filed on Mar. 27, 2020, in the Korean Intellectual Property Office, which is incorporated herein by reference in its entirety.

BACKGROUND

1. Technical Field

Various embodiments generally relate to a semiconductor circuit, and more particularly, to a differential Amplifier.

2. Related Art

A semiconductor circuit receives various signals, and control the voltage levels of the received signals in order to internally process the received signals or to output the received signals to the outside.

Therefore, the semiconductor circuit may use an Amplifier to control the voltage levels of signals, for example, a differential Amplifier.

SUMMARY

Various embodiments are directed to a low-power and high-performance differential Amplifier.

In an embodiment, a differential Amplifier of a memory controller may include: an amplification stage configured to amplify input differential signals to generate intermediate differential signals; a control circuit configured to control slew rates for the intermediate differential signals; and an output circuit configured to selectively perform one or more switching operations according to the intermediate differential signals to generate output differential signals.

In an embodiment, a differential Amplifier may include: an amplification stage configured to adjust values of first intermediate differential signals by amplifying input differential signals according to a compensation signal; a control circuit configured to adjust values of second intermediate differential signals according to the first intermediate differential signals and control slew rates for the first and second intermediate differential signals according to one or more bias signals; an output circuit configured to selectively perform one or more switching operations according to the first and second intermediate differential signals to generate output differential signals; a bias circuit configured to generate the one or more bias signals; and a compensation circuit configured to generate the compensation signal according to the input differential signals and a reference voltage.

In an embodiment, a differential Amplifier may include: an amplification circuit configured to adjust values of intermediate differential signals at floating nodes by amplifying input differential signals according to a compensation signal, and generate output differential signals by selectively switching output driving gates coupled to the floating nodes; and a compensation circuit configured to generate the compensation signal according to a reference voltage and the input differential signals.

DETAILED DESCRIPTION

Hereinafter, a differential Amplifier according to embodiments of the present disclosure will be described below with reference to the accompanying drawings.

Figure 1:
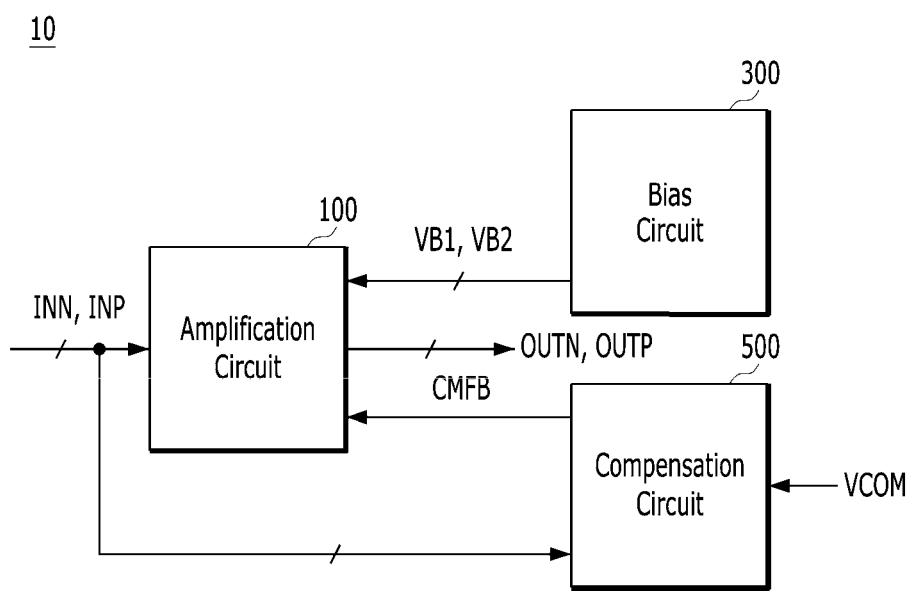
FIG. 1 is a diagram illustrating a configuration of a differential Amplifier in accordance with an embodiment.

FIG. 1 is a diagram illustrating a configuration of a Amplifier (e.g., a Differential amplifier) 10 in accordance with an embodiment.

Referring to FIG. 1, the differential Amplifier 10 may include an Amplification Circuit 100, a bias circuit 300, and a compensation circuit 500.

Figure 2:
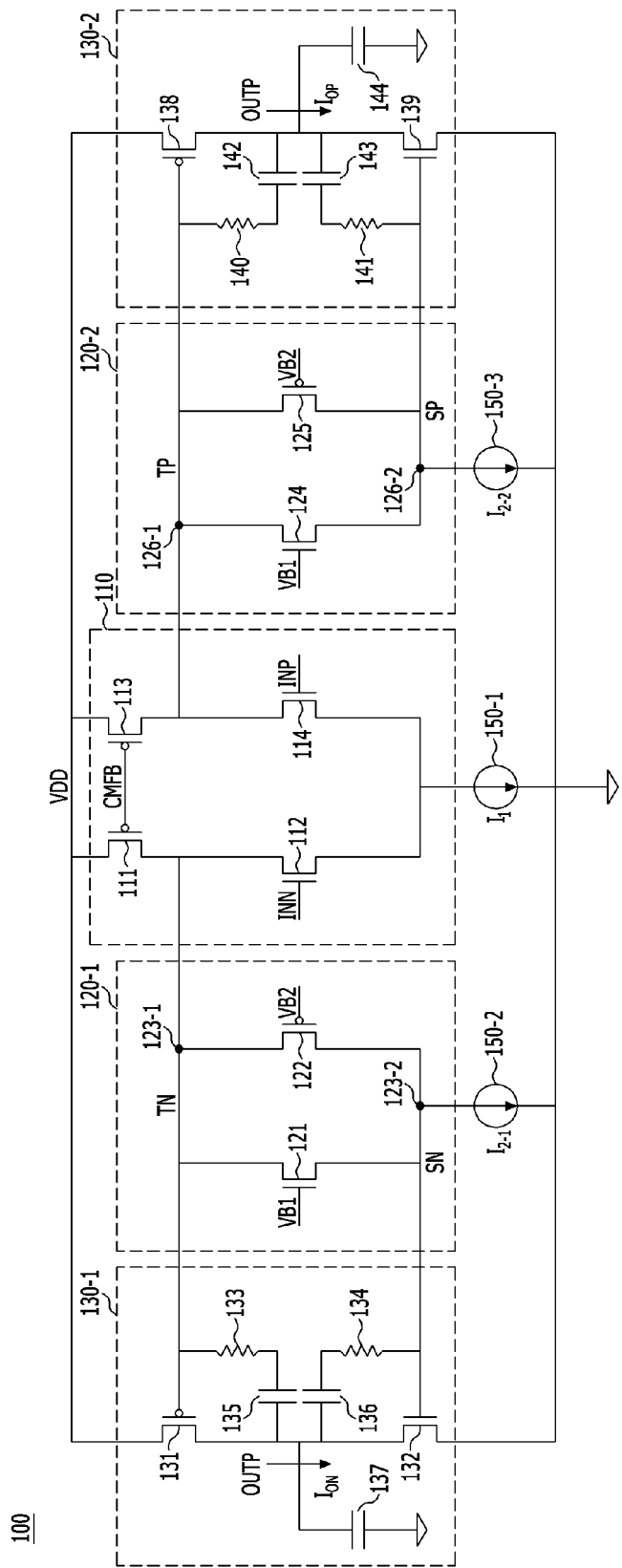
FIG. 2 is a diagram illustrating a configuration of an Amplification Circuit of FIG. 1 in accordance with an embodiment.

The Amplification Circuit 100 may control floating nodes (e.g., first, second, third, and fourth floating nodes 123-1, 126-1, 123-2, and 126-2 in FIG. 2) according to second differential signals (e.g., second differential signals TN, TP, SN, and SP in FIG. 2) generated by amplifying first differential signals INN and INP, and output third differential signals OUTN and OUTP by selectively switching output driving gates coupled to the floating nodes.

The first differential signals INN and INP may be referred to as input differential signals.

The second differential signals are internal signals and may be referred to as intermediate differential signals.

The third differential signals OUTN and OUTP may be referred to as output differential signals.

The Amplification Circuit 100 may generate the second differential signals by amplifying the first differential signals according to a compensation signal CMFB.

The Amplification Circuit 100 may control a slew rate for the second differential signals according to bias signals VB1 and VB2.

The bias circuit 300 may generate the bias signals VB1 and VB2 suitable for adjusting an operation bias point of the Amplification Circuit 100.

The compensation circuit 500 may generate the compensation signal CMFB according to the first differential signals INN and INP and a reference voltage VCOM.

FIG. 2 is a diagram illustrating the configuration of the Amplification Circuit 100 of FIG. 1 in accordance with an embodiment.

Referring to FIG. 2, the Amplification Circuit 100 may include an amplification stage 110, control circuits 120-1 and 120-2 and output circuits 130-1 and 130-2.

The Amplification Circuit 100 may further include a first current control circuit 150-1 and second current control circuits 150-2 and 150-3.

The amplification stage 110 may generate the second differential signals TN/TP and SN/SP by amplifying the first differential signals INN and INP according to the compensation signal CMFB.

The amplification stage 110 may include first to fourth transistors 111 to 114.

The first transistor 111 may have a first terminal (e.g., a source) coupled to a power supply terminal VDD, a control terminal (e.g., a gate) configured to receive the compensation signal CMFB, and a second terminal (e.g., a drain) coupled to a first floating node 123-1.

The voltage level of the first floating node 123-1 may be outputted as any one of the second differential signals TN/TP and SN/SP, for example, TN.

The second transistor 112 may have a drain coupled to the first floating node 123-1, a gate configured to receive any one of the first differential signals INN and INP, for example, INN, and a source coupled to the first current control circuit 150-1.

The third transistor 113 may have a source coupled to the power supply terminal VDD, a gate configured to receive the compensation signal CMFB, and a drain coupled to a second floating node 126-1.

The voltage level of the second floating node 126-1 may be outputted as any one of the second differential signals TN/TP and SN/SP, for example, TP.

The fourth transistor 114 may have a drain coupled to the second floating node 126-1, a gate configured to receive the other of the first differential signals INN and INP, for example, INP, and a source coupled to the first current control unit 150-1.

The control circuits 120-1 and 120-2 may control the slew rate for each of the second differential signals TN/TP and SN/SP according to the bias signals VB1 and VB2.

The control circuits 120-1 and 120-2 may be referred to as a first control circuit 120-1 and a second control circuit 120-2, respectively.

The first control circuit 120-1 may include a fifth transistor 121 and a sixth transistor 122.

The fifth transistor 121 may have a source coupled to a third floating node 123-2, a drain coupled to the first floating node 123-1, and a gate configured to receive any one of the bias signals VB1 and VB2, for example, VB1.

The voltage level of the third floating node 123-2 may be outputted as any one of the second differential signals TN/TP and SN/SP, for example, SN.

The sixth transistor 122 may have a source coupled to the first floating node 123-1, a drain coupled to the third floating node 123-2, and a gate configured to receive the other of the bias signals VB1 and VB2, for example, VB2.

The second control circuit 120-2 may include a seventh transistor 124 and an eighth transistor 125.

The seventh transistor 124 may have a source coupled to a fourth floating node 126-2, a drain coupled to the second floating node 126-1, and a gate configured to receive the one of the bias signals VB1 and VB2, for example, VB1.

The voltage of the fourth floating node 126-2 may be outputted as any one of the second differential signals TN/TP and SN/SP, for example, SP.

The eighth transistor 125 may have a source coupled to the second floating node 126-1, a drain coupled to the fourth floating node 126-2, and a gate configured to receive the other of the bias signals VB1 and VB2, for example, VB2.

The output circuits 130-1 and 130-2 may substantially linearly control the voltage levels of the second differential signals TN/TP and SN/SP according to voltage level variations of the third differential signals OUTN and OUTP.

The output circuits 130-1 and 130-2 may output the third differential signals OUTN and OUTP, respectively, by selectively switching output driving gates coupled to the first to fourth floating nodes 123-1, 126-1, 123-2 and 126-2.

The output driving gates may include ninth to 12th transistors 131, 132, 138 and 139 of the output circuits 130-1 and 130-2.

The output circuits 130-1 and 130-2 may be referred to as a first output unit 130-1 and a second output unit 130-2, respectively.

The first output circuit 130-1 may include the ninth transistor 131, the tenth transistor 132, a first resistor 133, a second resistor 134 and first to third capacitors 135 to 137.

The ninth transistor 131 may have a source coupled to the power supply terminal VDD and a gate coupled to the first floating node 123-1.

The tenth transistor 132 may have a source coupled to a ground terminal and a gate coupled to the third floating node 123-2.

The first resistor 133 may have one end coupled to the gate of the ninth transistor 131 and the first floating node 123-1 in common.

The second resistor 134 may have one end coupled to the gate of the tenth transistor 132 and the third floating node 123-2 in common.

The first capacitor 135 may have one end coupled to the other end of the first resistor 133.

The second capacitor 136 may have one end coupled to the other end of the second resistor 134.

The third capacitor 137 may have one end coupled to the drain of the ninth transistor 131, the other end of the first capacitor 135, the other end of the second capacitor 136 and the drain of the tenth transistor 132 in common.

The second output circuit 130-2 may include the 11th transistor 138, the 12th transistor 139, a third resistor 140, a fourth resistor 141 and fourth to sixth capacitors 142 to 144.

The 11th transistor 138 may have a source coupled to the power supply terminal VDD and a gate coupled to the second floating node 126-1.

The 12th transistor 139 may have a source coupled to the ground terminal and a gate coupled to the fourth floating node 126-2.

The third resistor 140 may have one end coupled to the gate of the 11th transistor 138 and the second floating node 126-1 in common.

The fourth resistor 141 may have one end coupled to the gate of the 12th transistor 139 and the fourth floating node 126-2 in common.

The fourth capacitor 142 may have one end coupled to the other end of the third resistor 140.

The fifth capacitor 143 may have one end coupled to the other end of the fourth resistor 141.

The sixth capacitor 144 may have one end coupled to the drain of the 11th transistor 138, the other end of the fourth capacitor 142, the other end of the fifth capacitor 143 and the drain of the 12th transistor 139 in common.

The first current control circuit 150-1 may control a sink current of the amplification stage 110.

The first current control circuit 150-1 may be coupled between the ground terminal and the source of the second transistor 112 and the source of the fourth transistor 114 in the amplification stage 110.

The second current control circuits 150-2 and 150-3 may control sink currents of the control circuits 120-1 and 120-2, respectively.

The second current control circuits 150-2 and 150-3 may be coupled to the third floating node 123-2 and the fourth floating node 126-2, respectively.

Any one of the second current control circuits 150-2 and 150-3, for example, the second current control circuit 150-2 may be coupled to the third floating node 123-2.

The other one of the second current control circuits 150-2 and 150-3, for example, the second current control circuit 150-3 may be coupled to the fourth floating node 126-2.

Figure 3:
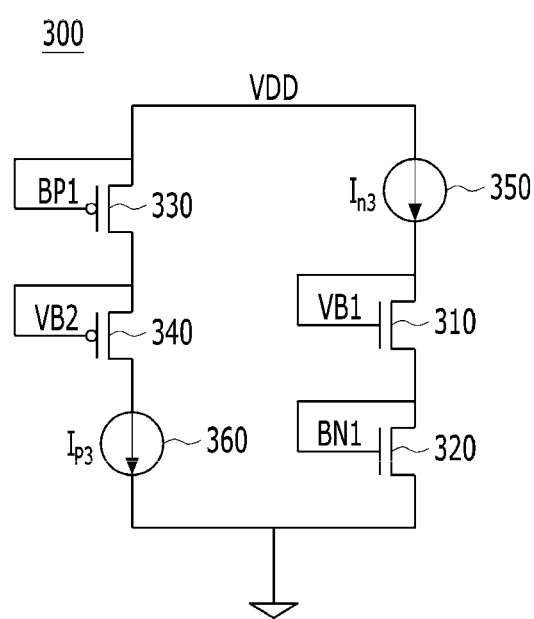
FIG. 3 is a diagram illustrating a configuration of a bias circuit of FIG. 1 in accordance with an embodiment.

FIG. 3 is a diagram illustrating the configuration of the bias circuit 300 of FIG. 1 in accordance with an embodiment.

Referring to FIG. 3, the bias circuit 300 may generate the bias signals VB1 and VB2 suitable for adjusting an operation bias point of the Amplification Circuit 100.

The bias circuit 300 may include first to fourth transistors 310, 320, 330 and 340 and current control circuits 350 and 360.

The first transistor 310 may have a gate coupled to a drain thereof.

The second transistor 320 may have a source coupled to the ground terminal and a gate coupled to a drain thereof and a source of the first transistor 310.

The first and second transistors 310 and 320 may form a first current path, and the gate level of any one of the first and second transistors 310 and 320, for example, the first transistor 310, may be used as the bias signal VB1. For example, although the bias circuit 300 in FIG. 3 generates a voltage VB1 at the gate of the first transistor 310 as the bias signal VB1, the bias circuit 300 according to another embodiment may generate a voltage BN1 at the gate of the second transistor 320 as the bias signal VB1.

The third transistor 330 may have a source coupled to the power supply terminal VDD and a gate coupled to the source thereof.

The fourth transistor 340 may have a source coupled to a drain of the third transistor 330 and a gate thereof.

The third and fourth transistors 330 and 340 may form a second current path, and the gate level of any one of the third and fourth transistors 330 and 340, for example, the fourth transistor 340, may be used as the bias signal VB2. For example, although the bias circuit 300 in FIG. 3 generates a voltage VB2 at the gate of the fourth transistor 340 as the bias signal VB2, the bias circuit 300 according to another embodiment may generate a voltage BP1 at the gate of the third transistor 330 as the bias signal VB2.

The current control circuit 350 may control a source current of the first current path.

The current control circuit 350 may be coupled between the power supply terminal VDD and the drain of the first transistor 310.

The other current control circuit 360 may control a sink current of the second current path.

The current control circuit 360 may be coupled between the drain of the fourth transistor 340 and the ground terminal.

The first to fourth transistors 310, 320, 330 and 340 may be configured as diode-connected transistors.

The bias circuit 300 may be designed in consideration of the relationships among amounts of currents, (e.g., $I_{p3}$ and $I_{n3}$ in FIG. 3 and $I_1$, $I_{2-1}$, $I_{2-2}$, $I_{OP}$ and $I_{on}$ in FIG. 2) and the sizes (e.g., gate widths) of the transistors 310, 320, 330, and 340 of the bias circuit 300 with respect to the transistors (e.g., the transistors 131, 132, 138, and 139 in FIG. 2) of the output circuits 130-1 and 130-2 and the transistors (e.g., the transistors 121, 122, 124, and 125 in FIG. 2) of the control circuits 120-1 and 120-2.

The operation bias point of the Amplification Circuit 100 may be adjusted to a target value by the bias signals VB1 and VB2 which are generated according to the above-described design.

Figure 4:
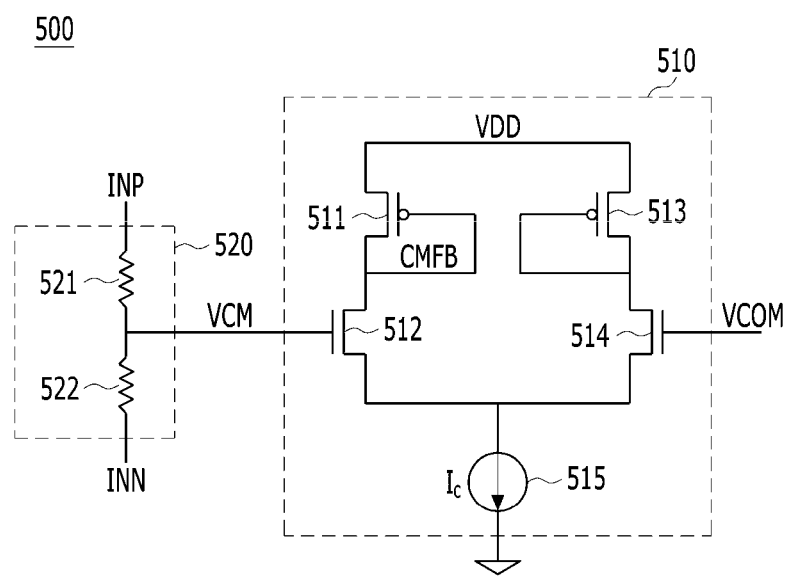
FIG. 4 is a diagram illustrating a configuration of a compensation circuit of FIG. 1 in accordance with an embodiment.

FIG. 4 is a diagram illustrating the configuration of the compensation circuit 500 of FIG. 1 according to an embodiment.

Referring to FIG. 4, the compensation circuit 500 may generate the compensation signal CMFB according to the first differential signals INN and INP and the reference voltage VCOM.

The compensation circuit 500 may include a replica circuit 510 and a divider resistor 520.

The replica circuit 510 may be configured by replicating the amplification stage 110 and the first current control circuit 150-1.

The replica circuit 510 may include first to fourth transistors 511 to 514 and a current control circuit 515.

The first transistor 511 may have a source coupled to the power supply terminal VDD and a gate coupled to a drain thereof.

The voltage level of the gate of the first transistor 511 may be used as the compensation signal CMFB.

The second transistor 512 may have a drain coupled to the drain of the first transistor 511, a gate configured to receive a divided voltage VCM, and a source coupled to the current control circuit 515.

The third transistor 513 may have a source coupled to the power supply terminal VDD and a gate coupled to a drain thereof.

The fourth transistor 514 may have a drain coupled to the drain of the third transistor 513, a gate configured to receive the reference voltage VCOM, and a source coupled to the current control circuit 515.

The current control circuit 515 may control a sink current of a current path formed through the first to fourth transistors 511 to 514.

The current control circuit 515 may be coupled between the sources of the second and fourth transistors 512 and 514 and the ground terminal.

The divider resistor 520 may divide the first differential signals INN and INP, and output an intermediate voltage level between the first differential signals INN and INP as the divided voltage VCM.

The divider resistor 520 may include first and second resistors 521 and 522.

The first resistor 521 may have one end configured to receive any one of the first differential signals INN and INP, for example, INP.

The second resistor 522 may have one end coupled to the other end of the first resistor 521 and the other end configured to receive the other of the first differential signals INN and INP, for example, INN.

The operation of the above-described compensation circuit 500 will be described as follows.

The reference voltage VCOM may be set to one of the target voltage levels associated with the first differential signals INN and INP, for example, the common voltage levels of the first differential signals INN and INP.

The divided voltage VCM corresponds to an intermediate voltage level between the first differential signals INN and INP.

Therefore, the compensation circuit 500 controls the level of the compensation signal CMFB such that the divided voltage VCM coincides with the reference voltage VCOM at substantially all times.

Figure 5:
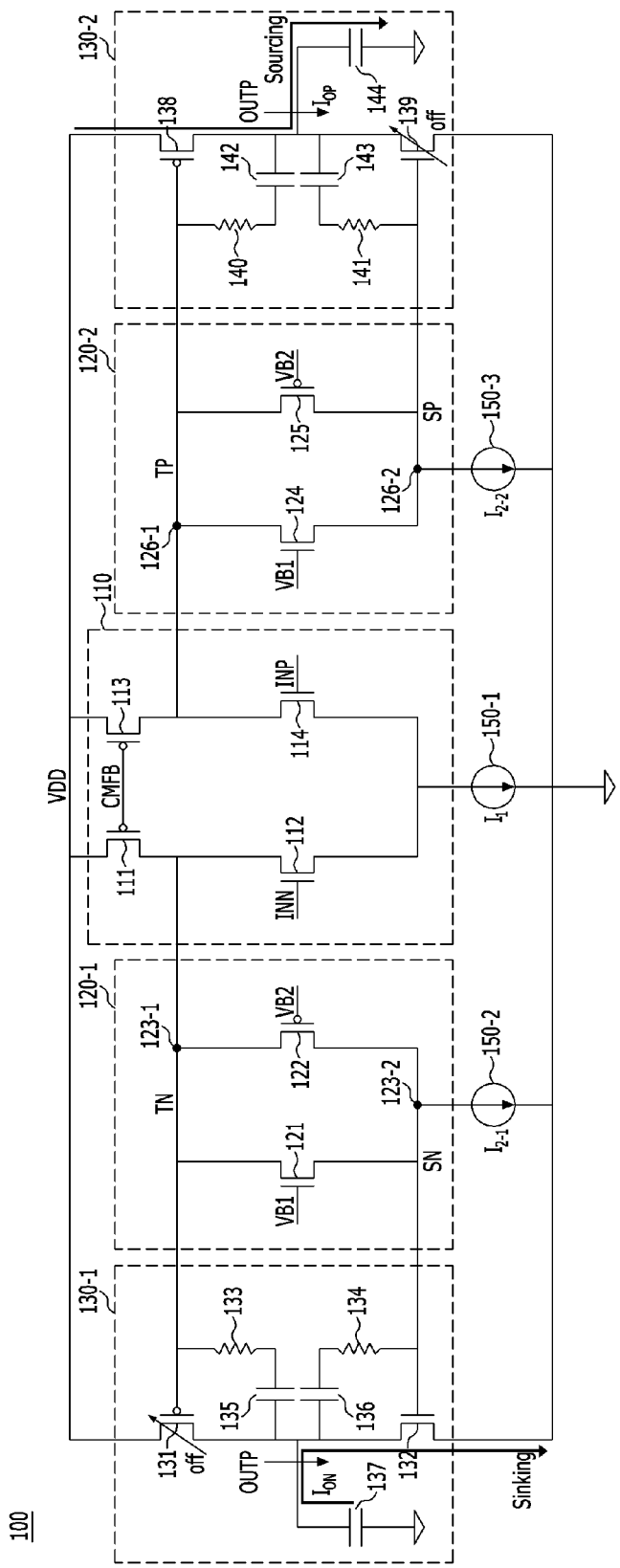
FIGS. 5 and 6 are diagrams each for describing an operation of the Amplification Circuit of FIG. 2 in accordance with an embodiment.
Figure 6:
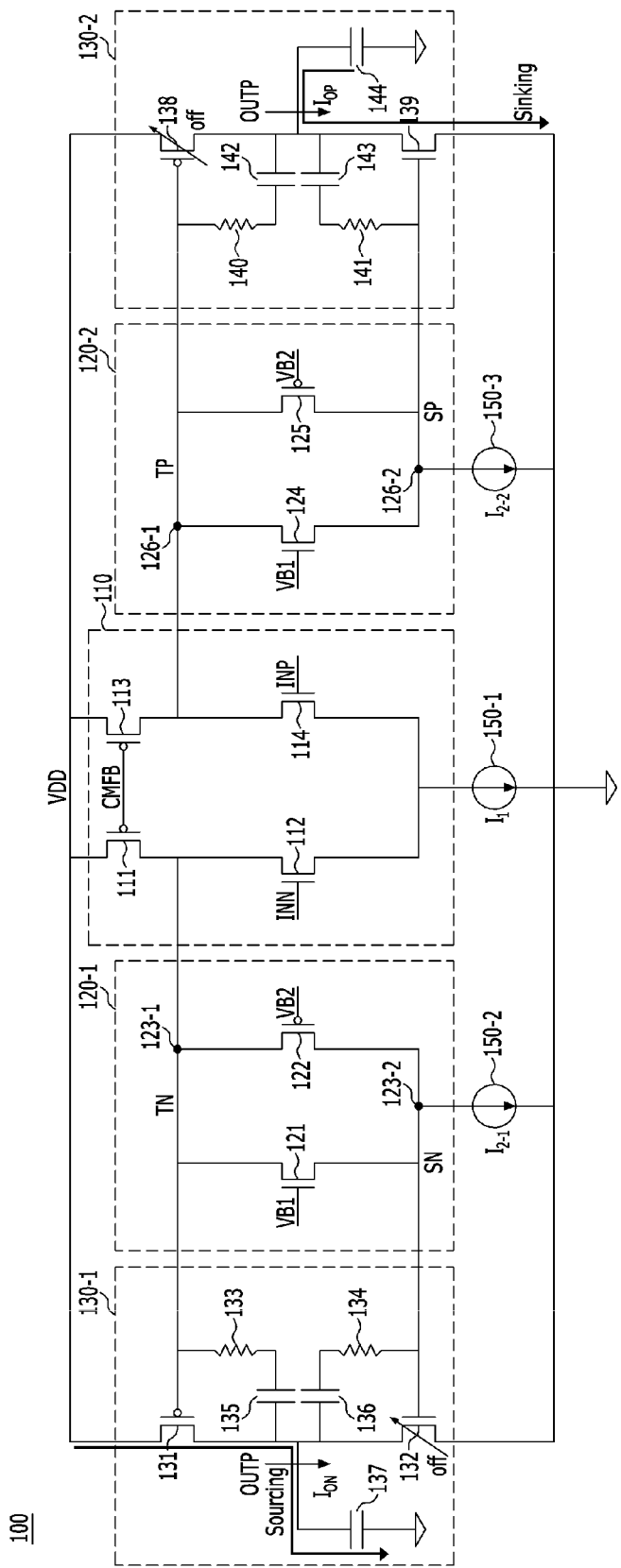

FIGS. 5 and 6 are diagrams each for describing an operation of the Amplification Circuit 100 of FIG. 2 according to an embodiment. Specifically, FIG. 5 is a diagram for describing the operation of the Amplification Circuit 100 when the voltage level of a first one INP of the first differential signals (or input differential signals) INN and INP is higher than the voltage level of a second one INN (INP>INN), and FIG. 6 is a diagram for describing the operation of the Amplification Circuit 100 when the voltage level of the second one INN of the input differential signals INN and INP is higher than the voltage level of the first one INP.

Referring to FIG. 5, the voltage level of OUTP of the third differential signals OUTN and OUTP falls because the voltage level of INP of the first differential signals INN and INP is higher than the voltage level of INN.

As the voltage level of OUTP falls, the voltage level of TP at the second floating node 126-1 of the second differential signals (or intermediate differential signals) TN/TP and SN/SP decreases. In other words, the amplification stage 110 may decrease the voltage level of TP according to the input differential signals INN and INP when the voltage level of INP is higher than the voltage level of INN.

Since the voltage levels of the bias signals VB1 and VB2 are kept substantially constant even though the voltage level of TP decreases, the eighth transistor 125 of the second control circuit 120-2 is turned off, and a current flows only though the seventh transistor 124. Thus, an amount of the current flowing through the seventh transistor 124 increases, and a gate-source voltage of the seventh transistor 124 increases. Because the gate of the seventh transistor 124 receives the bias signal VB1 having substantially constant voltage level and the source of the seventh transistor 124 is coupled to the fourth floating node 126-2, the voltage level of SP at the fourth floating node 126-2 also decreases. In other words, the second control circuit 120-2 may decrease the voltage level of SP according to the voltage level of TP when the voltage level of INP is higher than the voltage level of INN.

Since both of the voltage levels of TP and SP decrease, the 12th transistor 139 of the second output unit 130-2 is turned off, and a current $I_{OP}$ is sourced to the sixth capacitor 144 through the 11th transistor 138. The current $I_{OP}$ flowing through the 11th transistor 138 charges the sixth capacitor (or a second load capacitor) 144, thereby increasing the voltage level of a first output differential signal OUTP. In other words, the second output circuit 130-2 may selectively perform a switching operation on the 12th transistor 139 according to the intermediate differential signal TP, thereby generating the first output differential signal OUTP. For example, the 12th transistor 139 in the second output circuit 130-2 may be selectively turned off while the 11th transistor 138 keeps being turned on.

Since the voltage level of INN is lower than INP, the voltage levels of TN and SN among the second differential signals TN/TP and SN/SP increases.

Since the voltage levels of TN and SN increase, the ninth transistor 131 of the first output circuit 130-1 is turned off, and a current $I_{ON}$ is sunk from the third capacitor 137 through the tenth transistor 132. The current $I_{ON}$ flowing through the tenth transistor 132 discharges the third capacitor (or a first load capacitor) 137, thereby decreasing the voltage level of a second output differential signal OUTN.

Referring to FIG. 6, the voltage level of OUTN of the third differential signals OUTN and OUTP falls because the voltage level of INN of the first differential signals INN and INP is higher than the voltage level of INP.

As the voltage level of OUTN falls, the voltage level of TN at the first floating node 123-1 of the second differential signals TN/TP and SN/SP decreases.

Since the voltage levels of the bias signals VB1 and VB2 are kept substantially constant even though the voltage level of TN falls, the sixth transistor 122 of the first control unit 120-1 is turned off, and a current flows only though the fifth transistor 121. Thus, an amount of the current flowing through the fifth transistor 121 increases, and a gate-source voltage of the fifth transistor 121 increases. Because the gate of the fifth transistor 121 receives the bias signal VB1 having substantially constant voltage level and the source of the fifth transistor 121 is coupled to the third floating node 123-2, the voltage level of SN at the third floating node 123-2 also decreases.

Since both of the voltage levels of TN and SN decreases, the tenth transistor 132 of the first output circuit 130-1 is turned off, and the current $I_{ON}$ is sourced to the third capacitor 137 through the ninth transistor 131. The current $I_{ON}$ flowing through the ninth transistor 131 charges the third capacitor (or the first load capacitor) 137, thereby increasing the voltage level of a second output differential signal OUTN.

Since the voltage level of INP is lower than INN, the voltage levels of TP and SP among the second differential signals TN/TP and SN/SP increases.

Since the voltage levels of TP and SP increase, the 11th transistor 138 of the second output circuit 130-2 is turned off, and a current $I_{OP}$ is sunk from the sixth capacitor 144 through the 12th transistor 139. The current $I_{OP}$ flowing through the 12th transistor 139 discharges the sixth capacitor (or the second load capacitor) 144, thereby decreasing the voltage level of the first output differential signal OUTP.

As described with reference to FIGS. 5 and 6, the voltage levels of the first to fourth floating nodes 123-1, 126-1, 123-2 and 126-2 in accordance with an embodiment of the present disclosure are automatically controlled according to the first differential signals INN and INP. Specifically, the differential Amplification Circuit 100 automatically adjusts the voltage levels of the first to fourth floating nodes 123-1, 126-1, 123-2 and 126-2 that are respectively coupled to the ninth to twelfth transistors 131, 132, 138, and 139. In an embodiment, the differential Amplification Circuit 100 may function as Class AB amplifier circuit. For example, one of a pair of the ninth and tenth transistors 131 and 132 in the first output circuit 130-1 may be turned on and the other of the pair of the transistors 131 and 132 in the first output circuit 130-1 may be turned off. As a result, the first load capacitor 137 may be charged or discharged at a relative fast rate with a relatively small amount of the current $I_{ON}$ compared to a conventional amplifier circuit functioning as Class A amplifier circuit that includes transistors each being biased to operate within its linear region. Therefore, the differential Amplification Circuit 100 according to an embodiment of the present disclosure may effectively drive load capacitors 137 and 144 while reducing power consumption. In addition, because the differential Amplification Circuit 100 according to an embodiment uses a relatively small amount of the currents $I_{OP}$ and $I_{ON}$ each flowing through a corresponding one of the transistors 131, 132, 138, and 139, a size of each of the transistors 131, 132, 138, and 139 may be reduced to decrease the circuit area of the differential Amplification Circuit 100 compared to that of a conventional amplification circuit.

Therefore, the differential Amplification Circuit 100 can consume a small amount of static current when the input signals, i.e. INN and INP, coincide with each other within an error range, and perform current sourcing and current sinking when the voltage level of any one of INN and INP rises, thereby outputting a wide range of voltage through dynamic current supply.

Figure 7:
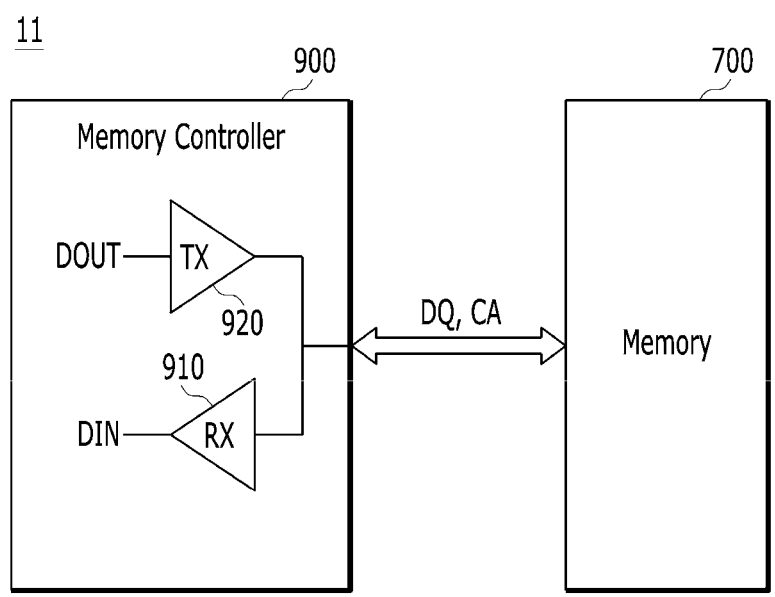
FIG. 7 is a diagram illustrating a configuration of a memory system in accordance with an embodiment.

FIG. 7 is a diagram illustrating a configuration of a memory system 11 in accordance with an embodiment.

Referring to FIG. 7, the memory system 11 may include a memory 700 and a memory controller 900.

The memory 700 may be configured as a chip or a memory module including a plurality of chips.

The memory 700 may include one of various memories such as DRAM, Flash RAM, MRAM, FRAM and ReRAM or a combination of two or more thereof.

The memory controller 900 may control data input/output of the memory 700.

The memory controller 900 may include a receiver (RX) 910 and a transmitter (TX) 920.

The receiver 910 may generate RX data DIN by receiving data DQ transmitted from the memory 700.

The transmitter 920 may transmit TX data DOUT of the memory controller 900 to the memory 700.

The TX data DOUT may include one or more of data, an address and a command.

A differential Amplifier (e.g., the differential Amplifier 10 as described with reference to FIGS. 1 to 6) according to an embodiment of the present disclosure may be included in the receiver 910, or the transmitter 920 of the memory controller 900, or both.

The configuration in which the differential Amplifier 10 is included in the receiver 910, or the transmitter 920 of the memory controller 900, or both. However, embodiments of the present disclosure are not limited thereto. For example the differential Amplifier 10 may be included in the memory 700 or included in various semiconductor devices receiving signals, or outputting signals, or both.

The differential Amplifier 10 in accordance with an embodiment of the present disclosure can consume a small amount of static current according to input signals, and perform current sourcing and current sinking according to a voltage difference between the input signals, thereby outputting a wide range of voltage through dynamic current supply. Thus, a semiconductor device including the differential Amplifier 10 can reduce the current consumption, and simultaneously improve the input/output performance.

In an embodiment, a method for differential Amplifier includes amplifying input differential signals to generate intermediate differential signals. Slew rates are controlled for the intermediate differential signals. One or more switching operations are selectively performed according to the intermediate differential signals to generate output differential signals.

In an embodiment, the method further includes adjusting values of the intermediate differential signals at floating nodes according to the input differential signals.

In an embodiment, the intermediate differential signals include first intermediate differential signals and second intermediate differential signals. The method further includes adjusting values of the first intermediate differential signals by amplifying the input differential signals and adjusting values of the second intermediate differential signals according to the first intermediate differential signals.

While various embodiments have been described above, it will be understood to those skilled in the art that the embodiments described are examples only. Accordingly, the differential Amplification Circuit described herein should not be limited based on the described embodiments.

What is claimed is:

1. A differential amplifier, comprising:
an amplification stage configured to amplify input differential signals to generate intermediate differential signals;
a control circuit configured to control slew rates for the intermediate differential signals; and
an output circuit configured to selectively perform one or more switching operations according to the intermediate differential signals to generate output differential signals,
wherein the output circuit comprises a plurality of capacitors coupled to nodes for outputting the output differential signals, respectively, and performs current sourcing through a first one of the plurality of capacitors and performs current sinking through a second one of the plurality of capacitors, when a voltage level of one of the input differential signals is higher than that of the other of the input differential signals.

2. The differential amplifier according to claim 1, wherein the control circuit controls the slew rates for the intermediate differential signals according to one or more bias signals.

3. The differential amplifier according to claim 1, wherein the control circuit comprises:
a first transistor and a second transistor coupled in parallel to a first floating node to which a first one of the intermediate differential signal is applied; and
a third transistor and a fourth transistor coupled in parallel to a second floating node to which a second one of the intermediate differential signals is applied.

4. The differential amplifier according to claim 3, wherein the first and third transistors are controlled by a first bias signal, and the second and fourth transistors are controlled by a second bias signal.

5. The differential amplifier according to claim 1, wherein the output circuit linearly controls voltage levels of the intermediate differential signals according to voltage level variations of the output differential signals.

6. The differential amplifier according to claim 1, wherein the output circuit comprises a transistor, a resistor and a capacitor that are coupled to one another, and
wherein any one of the intermediate differential signals is applied to the transistor and the resistor that are coupled to a floating node in common.

7. The differential amplifier according to claim 1, further comprising a first current control circuit configured to control a sink current of the amplification stage.

8. The differential amplifier according to claim 7, further comprising a second current control circuit configured to control a sink current of the output circuit.

9. A differential amplifier, comprising:
an amplification stage configured to adjust values of first intermediate differential signals by amplifying input differential signals according to a compensation signal;
a control circuit configured to adjust values of second intermediate differential signals according to the first intermediate differential signals and control slew rates for the first and second intermediate differential signals according to one or more bias signals;
an output circuit configured to selectively perform one or more switching operations according to the first and second intermediate differential signals to generate output differential signals;
a bias circuit configured to generate the one or more bias signals; and
a compensation circuit configured to generate the compensation signal according to the input differential signals and a reference voltage, wherein the output circuit comprises a plurality of capacitors coupled to nodes for outputting the output differential signals, respectively, and performs current sourcing through a first one of the plurality of capacitors and performs current sinking through a second one of the plurality of capacitors, when a voltage level of one of the input differential signals is higher than the other of the input differential signals.

10. The differential amplifier according to claim 9, wherein the control circuit comprises:
   a first transistor and a second transistor coupled in parallel to a first floating node to which one of the first intermediate differential signals is applied; and
   a third transistor and a fourth transistor coupled in parallel to a second floating node to which the other of the first intermediate differential signals is applied.

11. The differential amplifier according to claim 10, wherein the bias signals include first and second bias signals, and
   wherein the first and third transistors are controlled by the first bias signal, and the second and fourth transistors are controlled by the second bias signal.

12. The differential amplifier according to claim 9, wherein the output unit linearly controls the voltage levels of the first and second differential signals according to voltage level variations of the output differential signals.

13. The differential amplifier according to claim 9, further comprising:
   a first current control circuit configured to control a sink current of the amplification stage; and
   a second current control circuit configured to control a sink current of the output circuit.

14. A differential amplifier, comprising:
   an amplification circuit configured to adjust values of intermediate differential signals at floating nodes by amplifying input differential signals according to a compensation signal, and generate output differential signals by selectively switching output driving gates coupled to the floating nodes; and
   a compensation circuit configured to generate the compensation signal according to a reference voltage and the input differential signals,
   wherein the amplification circuit comprises a plurality of capacitors coupled to nodes for outputting the output differential signals, respectively, and performs current sourcing through a first one of the plurality of capacitors and performs current sinking through a second one of the plurality of capacitors, when a voltage level of one of the input differential signals is higher than that of the other of the input differential signals.

15. The differential amplifier according to claim 14, wherein the amplification circuit controls slew rates for the intermediate differential signals according to bias signals.

16. The differential amplifier according to claim 15, further comprising a bias circuit configured to generate the bias signals suitable for adjusting an operation bias point of the amplification circuit.

17. The differential amplifier according to claim 14, wherein the intermediate differential signals include first intermediate differential signals and second intermediate differential signals, and
   wherein the amplification circuit comprises:
   an amplification stage configured to adjust values of the first intermediate differential signals by amplifying the input differential signals;
   a control circuit configured to adjust values of the second intermediate differential signals according to the first intermediate differential signals and control the slew rates for the first and second intermediate differential signals; and
   an output circuit configured to selectively perform one or more switching operations according to the first and second intermediate differential signals and generate the output differential signals.

18. The differential amplifier according to claim 17, wherein the control circuit controls the slew rates for the first and second intermediate differential signals according to bias signals.

19. The differential amplifier according to claim 17, wherein the control circuit comprises:
   a first transistor and a second transistor coupled in parallel to a first one of the floating nodes to which a first one of the first and second intermediate differential signals is applied; and
   a third transistor and a fourth transistor coupled in parallel to a second one of the floating nodes to which a second one of the first and second intermediate differential signals is applied.

20. The differential amplifier according to claim 17, wherein the output circuit linearly controls voltage levels of the first and second intermediate differential signals according to voltage level variations of the output differential signals.

21. The differential amplifier according to claim 17, wherein the output circuit comprises a transistor, a resistor and a capacitor which are coupled to one another, and
   wherein any one of the first and second intermediate differential signals is applied to the transistor and the resistor that are commonly coupled to a corresponding one of the floating nodes.

22. The differential amplifier according to claim 17, further comprising:
   a first current control circuit configured to control a sink current of the amplification stage; and
   a second current control circuit configured to control a sink current of the output circuit.

* * * * *